United States Patent
Hasegawa et al.

(10) Patent No.: US 12,507,453 B2
(45) Date of Patent: Dec. 23, 2025

(54) SEMICONDUCTOR DEVICE AND MANUFACTURING METHOD OF SEMICONDUCTOR DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP); National University Corporation Tokai National Higher Education and Research System, Nagoya (JP)

(72) Inventors: Seiya Hasegawa, Nisshin (JP); Takashi Ushijima, Nisshin (JP); Takashi Ishida, Nisshin (JP); Shoichi Onda, Nagoya (JP); Chiaki Sasaoka, Nagoya (JP); Jun Kojima, Nagoya (JP)

(73) Assignees: DENSO CORPORATION, Kariya (JP); TOYOTA JIDOSHA KABUSHIKI KAISHA, Toyota (JP); MIRISE Technologies Corporation, Nisshin (JP); National University Corporation Tokai National Higher Education and Research System, Nagoya (JP)

( * ) Notice: Subject to any disclaimer, the term of this patent is extended or adjusted under 35 U.S.C. 154(b) by 372 days.

(21) Appl. No.: 18/346,556

(22) Filed: Jul. 3, 2023

(65) Prior Publication Data
US 2024/0014272 A1    Jan. 11, 2024

(30) Foreign Application Priority Data
Jul. 5, 2022    (JP) .................................. 2022-108558

(51) Int. Cl.
*H01L 29/20*    (2006.01)
*H01L 21/02*    (2006.01)
(Continued)

(52) U.S. Cl.
CPC ... *H10D 62/8503* (2025.01); *H01L 21/02458* (2013.01); *H01L 21/20* (2013.01);
(Continued)

(58) Field of Classification Search
CPC .......... H10D 62/8503; H01L 21/02458; H01L 21/20; H01L 21/268; H01L 21/56; H01L 21/78; H01L 21/3043
See application file for complete search history.

(56) References Cited

U.S. PATENT DOCUMENTS

2008/0070380 A1    3/2008    Kusunoki
2010/0233835 A1    9/2010    Kusunoki
(Continued)

FOREIGN PATENT DOCUMENTS

WO    2016/189986 A1    12/2016

OTHER PUBLICATIONS

Jun Huang et al., "Nanoscale anisotropic plastic deformation in single crystal GaN", Nanoscale Research Letters, 7(150), Feb. 22, 2012. (Discussed on p. 10 of the specification).
(Continued)

*Primary Examiner* — Leonardo Andujar
(74) *Attorney, Agent, or Firm* — Posz Law Group, PLC

(57) ABSTRACT

A semiconductor device includes a gallium nitride substrate and a pattern film disposed on a front surface of the gallium nitride substrate. In the gallium nitride substrate, a Young's modulus in a first direction along the front surface is larger than a Young's modulus in a second direction along the front surface and orthogonal to the first direction. A first ratio R1 obtained by dividing a dimension of the gallium nitride
(Continued)

substrate in the first direction by a dimension of the gallium nitride substrate in the second direction and a second ratio R2 obtained by dividing a dimension of the pattern film in the first direction by a dimension of the pattern film in the second direction satisfy a relationship of R1<R2.

9 Claims, 10 Drawing Sheets

(51) Int. Cl.
    *H01L 21/20*     (2006.01)
    *H01L 21/268*     (2006.01)
    *H01L 21/56*     (2006.01)
    *H01L 21/78*     (2006.01)
    *H10D 62/85*     (2025.01)

(52) U.S. Cl.
    CPC ............ *H01L 21/268* (2013.01); *H01L 21/56* (2013.01); *H01L 21/78* (2013.01)

(56) References Cited

U.S. PATENT DOCUMENTS

2019/0224784 A1    7/2019    Fujiwara et al.
2021/0183652 A1*    6/2021    Chiao ............... H01L 21/02502

OTHER PUBLICATIONS

Yutian Cheng et al., "Anisotropic Fracture Toughness of Bulk GaN", Physica Status Solidi B, 255(1700515), 2018. (Discussed on p. 10 of the specification).

C. Roder et al., "Stress and wafer bending of a-plane GaN layers on r-plane sapphire substrates", Journal of Applied Physics, 100(103511), Nov. 20, 2006. (Discussed on p. 12 of the specification).

Eldad Bahat Treidel et al., "On the Conduction Properties of Vertical GaN n-Channel Trench MISFETs", Journal of the Electron Devices Society, vol. 9, Feb. 25, 2021: pp. 215-228. (Discussed on p. 20 of the specification).

Shota Kaneki, "Interface Control of Al2O3/GaN Structures for MOS-gate High Electron Mobility Transistors", Doctoral Dissertation 14586 Hokkaido University, Mar. 25, 2021 (and partial English translation).

* cited by examiner

SINGLE CRYSTAL GALLIUM NITRIDE

| YOUNG'S MODULUS (MPa) | | | RATIO OF (0001) DIRECTION TO (11-20) DIRECTION (%) |
|---|---|---|---|
| (10-10) DIRECTION | (11-20) DIRECTION | (0001) DIRECTION | |
| 330560 | 329740 | 333610 | 101.17 |
| 308260 | 306960 | 317340 | 103.38 |
| 311300 | 314000 | 328500 | 104.62 |
| 329740 | 330560 | 333610 | 101.00 |
| 306960 | 308260 | 317340 | 102.95 |

| GALLIUM NITRIDE ON SAPPHIRE SUBSTRATE |||
|---|---|---|
| YOUNG'S MODULUS (MPa) || RATIO OF (0001) DIRECTION TO (10-10) DIRECTION (%) |
| (10-10) DIRECTION | (0001) DIRECTION | |
| 306000 | 363000 | 118.63 |

SEMICONDUCTOR DEVICE AND MANUFACTURING METHOD OF SEMICONDUCTOR DEVICE

CROSS REFERENCE TO RELATED APPLICATION

The present application claims the benefit of priority from Japanese Patent Application No. 2022-108558 filed on Jul. 5, 2022. The entire disclosure of the above application is incorporated herein by reference.

TECHNICAL FIELD

The present disclosure relates to a semiconductor device and a manufacturing method of a semiconductor device.

BACKGROUND

There has been known a technique of forming a modified layer inside a substrate formed of gallium nitride by irradiating the substrate with a laser and thinning the substrate by dividing the substrate along the modified layer.

SUMMARY

A semiconductor device according to one aspect of the present disclosure includes a gallium nitride substrate and a pattern film disposed on a front surface of the gallium nitride substrate. In the gallium nitride substrate, a Young's modulus in a first direction along the front surface is larger than a Young's modulus in a second direction along the front surface and orthogonal to the first direction. A first ratio R1 obtained by dividing a dimension of the gallium nitride substrate in the first direction by a dimension of the gallium nitride substrate in the second direction and a second ratio R2 obtained by dividing a dimension of the pattern film in the first direction by a dimension of the pattern film in the second direction satisfy a relationship of R1<R2. A manufacturing method of a semiconductor device according to another aspect of the present disclosure includes forming a groove portion on a front surface of a gallium nitride substrate to divide the front surface of the gallium nitride substrate into multiple regions, irradiating the gallium nitride substrate with a laser to form a modified layer that extends along the front surface and is located inside the gallium nitride substrate in a depth range of the groove portion, and dividing the gallium nitride substrate along the modified layer. In the gallium nitride substrate, a Young's modulus in a first direction along the front surface is larger than a Young's modulus in a second direction along the front surface and orthogonal to the first direction. The forming of the groove portion includes forming the groove portion along the first direction and the second direction to partition the front surface into the multiple regions such that a dimension of each of the regions in the first direction is larger than a dimension of each of the regions in the second direction.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
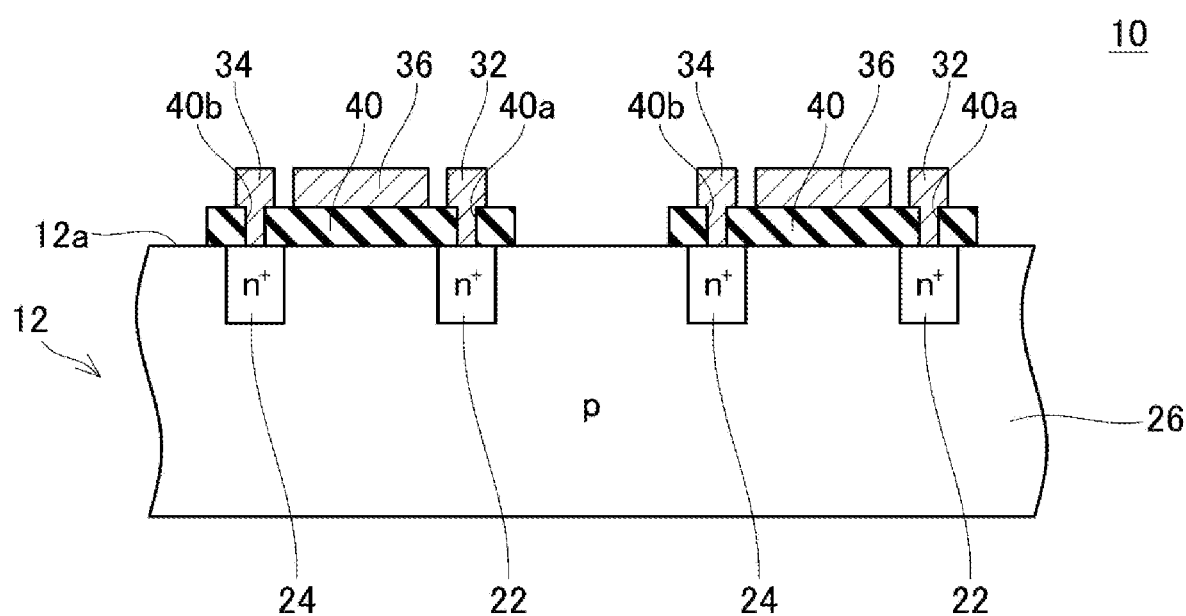
FIG. 1 is a cross-sectional view of a part of a semiconductor device according to a first embodiment.

Gallium nitride has multiple crystal planes, and Young's modulus differs depending on a direction along each crystal plane. Since a strain amount with respect to stress is larger in a plane direction in which the Young's modulus is small than in a plane direction in which the Young's modulus is large, a gallium nitride substrate has a property of being easily warped in a specific direction. In a state where the gallium nitride substrate is warped, it is difficult to irradiate the laser in parallel with a desired plane and it is difficult to accurately divide the gallium nitride substrate along the desired plane. In addition, since the gallium nitride substrate may warp in the specific direction, for example, it is difficult for a semiconductor device manufactured using the gallium nitride substrate to have stable characteristics.

A semiconductor device according to a first aspect of the present disclosure includes a gallium nitride substrate and a pattern film disposed on a front surface of the gallium nitride substrate. In the gallium nitride substrate, a Young's modulus in a first direction along the front surface is larger than a Young's modulus in a second direction along the front surface and orthogonal to the first direction. A first ratio R1 obtained by dividing a dimension of the gallium nitride substrate in the first direction by a dimension of the gallium nitride substrate in the second direction and a second ratio R2 obtained by dividing a dimension of the pattern film in the first direction by a dimension of the pattern film in the second direction satisfy a relationship of R1<R2.

A strain amount of the gallium nitride substrate in a specific direction is proportional to stress applied to the gallium nitride substrate in the specific direction and inversely proportional to the Young's modulus of the gallium nitride substrate in the specific direction. The stress applied to the gallium nitride substrate in the specific direction is proportional to the dimension of the gallium nitride substrate in the specific direction. On the other hand, the pattern film disposed on the front surface of the gallium nitride substrate expands and contracts due to a temperature change during and after formation and a heat generation cycle during operation of the semiconductor device. Therefore, tensile stress and compressive stress caused by expansion and contraction of the pattern film disposed on the front surface of the gallium nitride substrate are applied to the gallium nitride substrate. The stress applied from the pattern film in a specific direction of the gallium nitride substrate is proportional to the dimension of the pattern film in the specific direction. In the above-described semiconductor device, the first ratio R1 is smaller than the second ratio R2. That is, the ratio of the dimension of the pattern film in the second direction with respect to the first direction is smaller than that of the gallium nitride substrate. Therefore, the strain amount due to the difference between the Young's modulus in the first direction and the Young's modulus in the second direction of the gallium nitride substrate is relaxed by the stress applied from the pattern film to the gallium nitride substrate, and the difference in the strain amount between the first direction and the second direction is reduced. Therefore, in the above-described semiconductor device, the gallium nitride substrate is less likely to warp, and the characteristics of the semiconductor device can be stabilized.

A manufacturing method of a semiconductor device according to a second aspect of the present disclosure includes forming a groove portion on a front surface of a gallium nitride substrate to divide the front surface of the gallium nitride substrate into multiple regions, irradiating the gallium nitride substrate with a laser to form a modified layer that extends along the front surface and is located inside the gallium nitride substrate in a depth range of the groove portion, and dividing the gallium nitride substrate along the modified layer. In the gallium nitride substrate, a Young's modulus in a first direction along the front surface is larger than a Young's modulus in a second direction along the front surface and orthogonal to the first direction. The forming of the groove portion includes forming the groove portion along the first direction and the second direction to partition the front surface into the multiple regions such that a dimension of each of the regions in the first direction is larger than a dimension of each of the regions in the second direction.

A strain amount of the gallium nitride substrate in a specific direction is proportional to the stress applied to the gallium nitride substrate in the specific direction and inversely proportional to the Young's modulus of the gallium nitride substrate in the specific direction. The stress applied to the gallium nitride substrate in the specific direction is proportional to the dimension of the gallium nitride substrate in the specific direction. In the above-described manufacturing method, the groove portion is formed such that the dimension in the first direction in which the Young's modulus is large is larger than the dimension in the second direction in which the Young's modulus is small. That is, each of the regions defined by the groove portion has the dimension in the first direction larger than the dimension in the second direction. In each of the regions, the dimension in the first direction in which the Young's modulus is large (that is, strain is less likely to occur) is larger than the dimension in the second direction in which the Young's modulus is small (that is, strain is likely to occur). Therefore, in the depth range in which the groove portion is formed, the difference in the strain amount between the first direction and the second direction is reduced, and warpage is restricted in each of the regions. Since the modified layer is formed by irradiating the gallium nitride substrate in which the warpage is restricted with the laser, the modified layer can be formed along the front surface (that is, along a desired plane).

In the semiconductor device according to the first aspect of the present disclosure, the first ratio R1 may be greater than 1, and the second ratio R2 may be greater than 1. The Young's modulus of the gallium nitride substrate in the first direction is larger than the Young's modulus of the gallium nitride substrate in the second direction. In such a configuration, since the dimension of the gallium nitride substrate in the first direction is larger than the dimension of the gallium nitride substrate in the second direction, warpage caused by the difference in the Young's modulus in each direction can be reduced.

In the semiconductor device according to the first aspect of the present disclosure, the surface may be an m-plane, the first direction may be a (0001) direction, and the second direction may be a (11-20) direction. In such a configuration, by setting the first direction and the second direction to directions perpendicular to the crystal plane of gallium nitride, variation in Young's modulus in each direction is reduced, and warpage of the gallium nitride substrate can be stably reduced.

In the semiconductor device according to the first aspect of the present disclosure, a relationship of $1.01R1 \leq R2 \leq 1.25R1$ may be satisfied. In such a configuration, the strain amount in the first direction and the second direction of the gallium nitride substrate can be made uniform.

In the semiconductor device according to the first aspect of the present disclosure, a relationship of $1.01R1 \leq R2 \leq 1.05R1$ may be satisfied. In such a configuration, the strain amount in the first direction and the second direction of the gallium nitride substrate can be made more uniform.

In the manufacturing method according to the second aspect of the present disclosure, the front surface may be an m-plane, the first direction may be a (0001) direction, and the second direction may be a (11-20) direction. In such a configuration, the modified layer is formed along the m-plane. Since the m-plane is a plane that is easily cleaved, the gallium nitride substrate can be easily divided along the modified layer. In addition, the m-plane has good workability, and a semiconductor structure can be easily formed inside the gallium nitride substrate in a later process.

In the manufacturing method according to the second aspect of the present disclosure, a ratio S obtained by dividing the dimension of each of the regions in the first direction by the dimension of each of the regions in the second direction may satisfy a relationship of $1.01 \leq S \leq 1.25$. In such a configuration, the strain amount in the first direction and the second direction of the gallium nitride substrate after dividing can be made uniform.

In the manufacturing method according to the second aspect of the present disclosure, a ratio S obtained by dividing the dimension of each of the regions in the first direction by the dimension of each of the regions in the second direction may satisfy a relationship of $1.01 \leq S \leq 1.05$. In such a configuration, the strain amount in the first direction and the second direction of the gallium nitride substrate after dividing can be made uniform.

First Embodiment

A semiconductor device 10 according to a first embodiment will be described with reference to the drawings. As shown in FIG. 1, the semiconductor device 10 is a lateral metal-oxide-semiconductor field-effect transistor (MOSFET). The semiconductor device 10 includes a gallium nitride substrate 12, a drain electrode 32, a source electrode 34, a gate electrode 36, and an insulating film 40.

Figure 2:
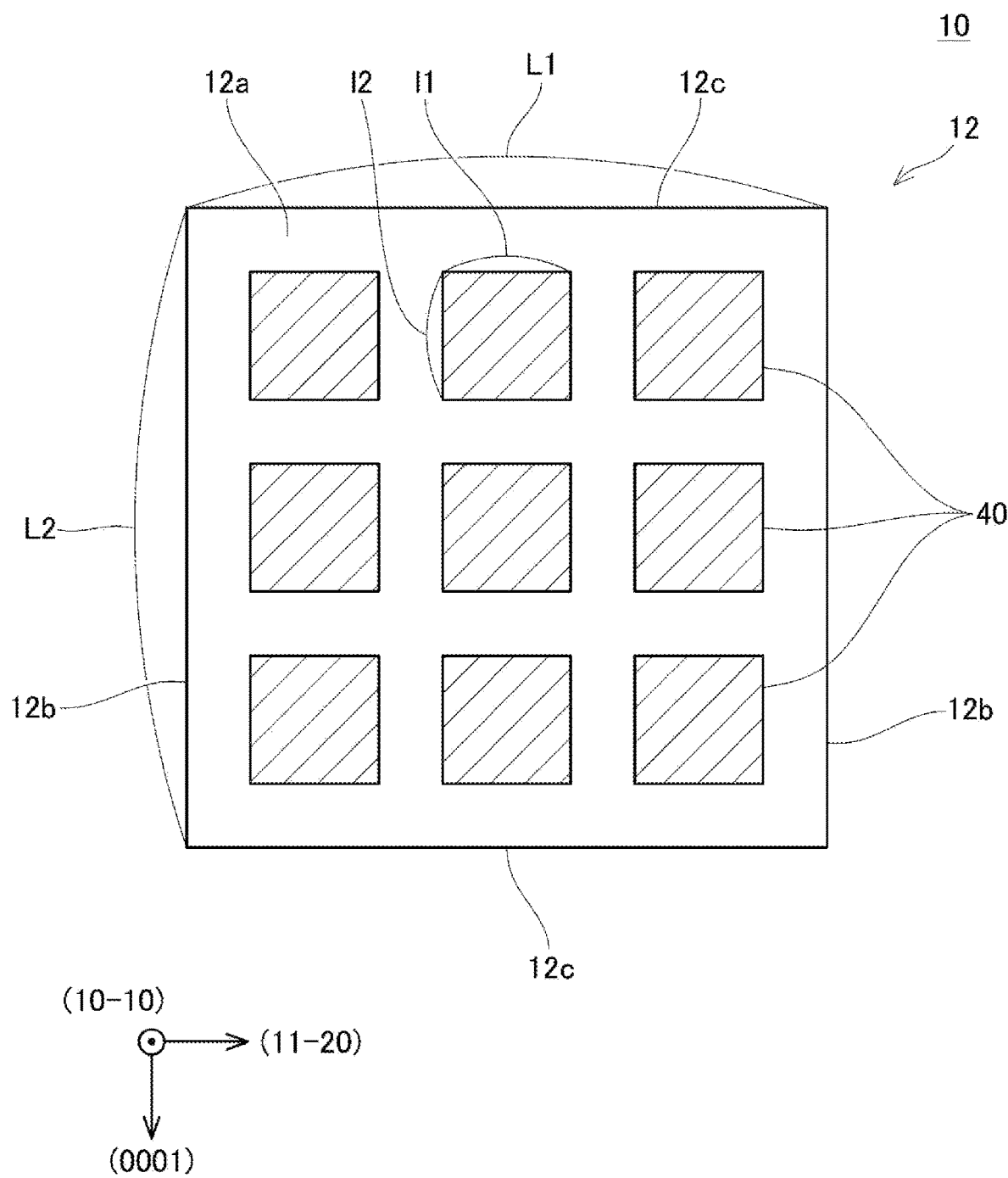
FIG. 2 is a plan view of the semiconductor device according to the first embodiment.

The gallium nitride substrate 12 is formed of a single crystal of gallium nitride. As shown in FIG. 2, in the present embodiment, the gallium nitride substrate 12 has a substantially square shape defined by two parallel end surfaces 12b and two parallel end surfaces 12c orthogonal to the end surface 12b when viewed from above. The gallium nitride substrate 12 has a hexagonal crystal structure. A front surface 12a is an m-plane, the end surfaces 12b are a-planes, and the end surface 12c are c-planes. A direction orthogonal to the m-plane is a (10-10) direction, a direction orthogonal to the a-planes is a (11-20) direction, and a direction orthogonal to the c-planes is a (0001) direction.

As shown in FIG. 1, multiple drain regions 22, multiple source regions 24, and a body region 26 are provided inside the gallium nitride substrate 12.

The drain regions 22 are n-type regions. The drain regions 22 are disposed at positions exposed on the front surface 12a of the gallium nitride substrate 12. The source regions 24 are n-type regions. The source regions 24 are disposed at intervals from the drain regions 22 and are disposed at positions exposed on the front surface 12a of the gallium nitride substrate 12. The body region 26 is a p-type region. The body region 26 is exposed on the front surface 12a of the gallium nitride substrate 12 in a portion located between the drain regions 22 and the source regions 24. The body region 26 extends from the portion located between the drain regions 22 and the source regions 24 to a portion located below the drain regions 22 and the source region 24. The drain regions 22 and the source regions 24 are separated from each other by the body region 26.

The insulating film 40 covers the front surface 12a of the gallium nitride substrate 12 in a range extending from the drain region 22 to the source region 24. The insulating film 40 has a through hole 40a above the drain region 22. The insulating film 40 has a through hole 40b above the source region 24.

The drain electrode 32 is in ohmic contact with the drain region 22 through the through hole 40a of the insulating film 40. The source electrode 34 is in ohmic contact with the source region 24 through the through hole 40b of the insulating film 40. The gate electrode 36 is disposed on an upper surface of the insulating film 40. The gate electrode 36 is disposed in a range that faces the body region 26 located between the drain region 22 and the source region 24. The gate electrode 36 is insulated from the gallium nitride substrate 12 by the insulating film 40.

As shown in FIG. 2, in the present embodiment, nine insulating films 40 are disposed on the front surface 12a of the gallium nitride substrate 12. In FIG. 2, the drain electrode 32, the source electrode 34, and the gate electrode 36 are not illustrated. Each of the insulating films 40 has a rectangular shape when viewed from above. Each of the insulating films 40 is disposed such that respective sides are parallel to the end surfaces 12b or the end surfaces 12c. As shown in FIG. 2, when a dimension of the gallium nitride substrate 12 in the (11-20) direction is denoted as L1, a dimension of the gallium nitride substrate 12 in the (0001) direction is denoted as L2, a dimension of each of the insulating films 40 in the (11-20) direction is denoted as I1, and a dimension of each of the insulating films 40 in the (0001) direction is denoted as I2, a first ratio L1/L2=R1 and a second ratio I1/I2=R2 satisfy a relationship of $1.01R1 \leq R2 \leq 1.05R1$.

When the semiconductor device 10 is used, an on-voltage is applied to the gate electrode 36. Then, an inversion layer is formed in the body region 26 in a range facing the insulating film 40, that is, the range between the drain region 22 and the source region 24. Accordingly, the drain region 22 connected to the drain electrode 32 and the source region 24 connected to the source electrode 34 are connected to each other via the inversion layer, and the drain electrode 32 and the source electrode 34 are electrically connected to each other. As a result, the semiconductor device 10 is turned on. When the voltage of the gate electrode 36 is lowered to an off-voltage, the inversion layer formed in the body region 26 disappears, and the semiconductor device is turned off.

Figures 3, 4:
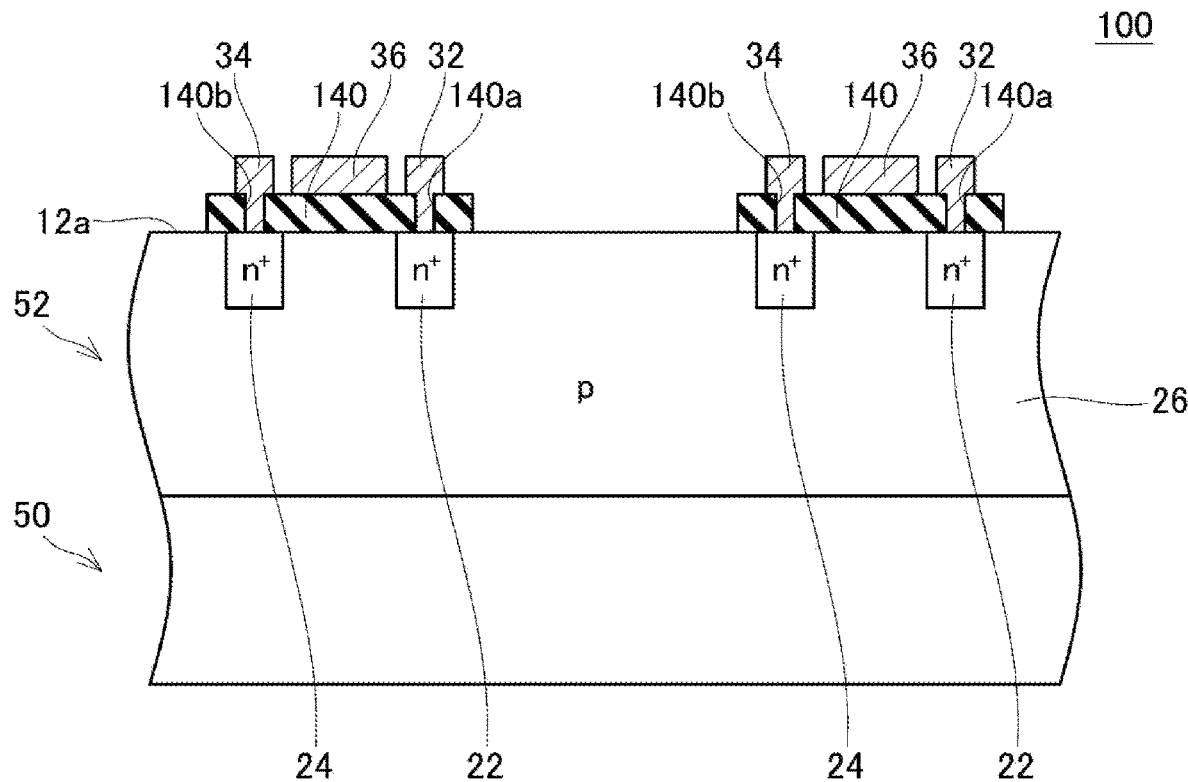
FIG. 3 is a diagram showing a relationship between plane directions and Young's moduli of gallium nitride.
FIG. 4 is a cross-sectional view of a part of a semiconductor device according to a second embodiment.

The semiconductor device 10 generates heat during use. The gallium nitride substrate 12 is applied with stress due to a temperature change of the semiconductor device 10. A strain amount of the gallium nitride substrate 12 in a specific direction is proportional to stress applied to the gallium nitride substrate 12 in the specific direction and inversely proportional to a Young's modulus of the gallium nitride substrate 12 in the specific direction. FIG. 3 shows literature values of the Young's moduli in respective plane directions in a single crystal gallium nitride disclosed in Huang et al., Nanoscale Research Letters, 7 (150), 2012 and Cheng et al., basis solid state physics, 255 (5), 2018, and ratios of the Young's modulus in the (0001) direction to the Young's modulus in the (11-20) direction in respective literature values. As shown in FIG. 3, the single crystal gallium nitride has different Young's moduli in the (10-10) direction, the (11-20) direction, and the (0001) direction. Specifically, in the single crystal gallium nitride, the Young's modulus in the (0001) direction is 1.01 to 1.05 times the Young's modulus in the (11-20) direction. That is, in the gallium nitride substrate 12, the Young's modulus in the (11-20) direction is smaller than the Young's modulus in the (0001) direction. The stress generated in the gallium nitride substrate 12 in the specific direction increases with increase in the dimension in the specific direction. In the present embodiment, the gallium nitride substrate 12 has a substantially square shape when viewed from above, and the dimension L1 in the (11-20) direction is equal to the dimension L2 in the (0001) direction. As described above, since the dimension L1 in the (11-20) direction is equal to the dimension L2 in the (0001) direction and the Young's modulus in the (11-20) direction is smaller than the Young's modulus in the (0001) direction, the gallium nitride substrate 12 is more easily strained in the (11-20) direction than in the (0001) direction. However, in the present embodiment, the insulating film 40 is disposed on the front surface 12a of the gallium nitride substrate 12. The insulating film 40 expands and contracts due to a temperature change during and after formation and a heat generation cycle during operation of the semiconductor device 10. Therefore, tensile stress and compressive stress caused by expansion and contraction of the insulating film 40 disposed on the front surface 12a are applied to the gallium nitride substrate 12. The stress applied from the insulating film 40 in a specific direction of the gallium nitride substrate 12 is proportional to the dimension of the insulating film 40 in the specific direction. In the present embodiment, as described above, the first ratio R1 and the second ratio R2 satisfy a relationship of $1.01R1 \leq R2 \leq 1.05R1$. Since the first ratio R1 is larger than the second ratio R2, the insulating film 40 has a shape in which the ratio of the length in the (11-20) direction is larger than that of the gallium nitride substrate 12. Therefore, the stress applied from the insulating film 40 to the gallium nitride substrate 12 is larger in the (11-20) direction than in the (0001) direction. Therefore, the difference in the strain amount between the (11-20) direction and the (0001) direction is reduced. In particular, the second ratio R2 is set to be 1.01 to 1.05 times as large as the first ratio R1, which is a value substantially equal to the ratio of the Young's modulus in the (0001) direction to the Young's modulus in the (11-20) direction of the gallium nitride substrate 12 shown in FIG. 3. Therefore, the strain amount in the (11-20) direction and the (0001) direction of the gallium nitride substrate 12 is made uniform by the stress applied from the insulating film 40. Therefore, the gallium nitride substrate 12 is less likely to warp, and the semiconductor device 10 can have stable characteristics.

In the present embodiment, the insulating film 40 is an example of a "pattern film". The (11-20) direction and the (0001) direction are examples of a "first direction" and a "second direction", respectively.

Second Embodiment

Figures 5, 6:
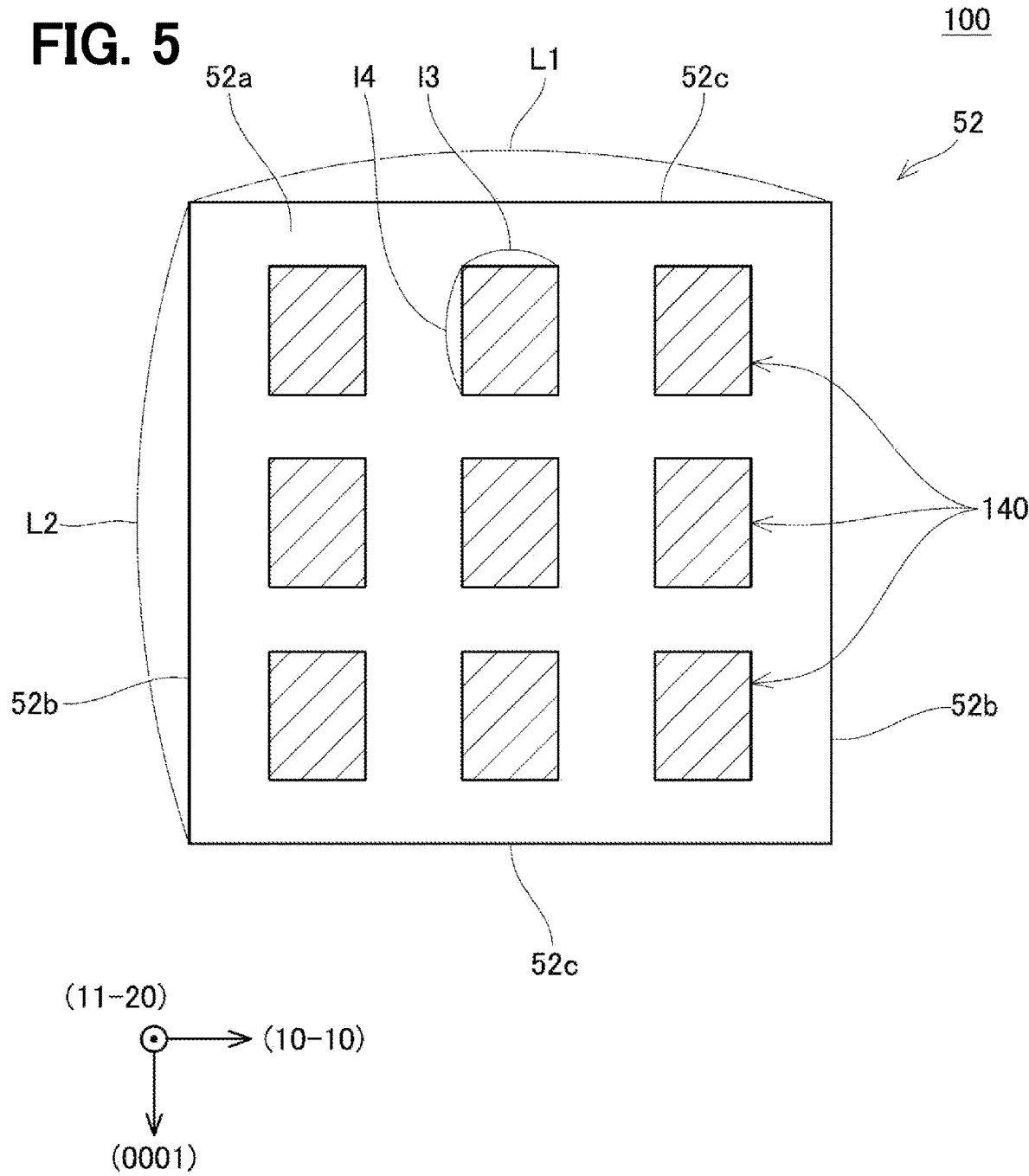
FIG. 5 is a plan view of the semiconductor device according to the second embodiment.
FIG. 6 is a diagram showing a relationship between plane directions and Young's moduli of gallium nitride grown on a sapphire substrate.

In a semiconductor device 100 of a second embodiment, as shown in FIG. 4, a gallium nitride substrate 52 is disposed on a surface of a sapphire substrate 50. The gallium nitride substrate 52 is a layer formed on the surface of the sapphire substrate 50 by epitaxial growth. As shown in FIG. 5, the gallium nitride substrate 52 has a substantially square shape defined by two parallel end surfaces 52b and two parallel end surfaces 52c orthogonal to the end surface 52b when viewed from above. In the present embodiment, a front surface 52a of the gallium nitride substrate 52 is an a-plane, the end surfaces 52b are m-planes, and the end surfaces 52c are a c-planes. An internal structure (that is, drain regions 22, source regions 24, and a body region 26) of the gallium nitride substrate 52 is the same as that of the first embodiment.

As shown in FIG. 5, nine insulating films 140 are disposed on the front surface 52a of the gallium nitride substrate 52. Each of the insulating films 140 has a rectangular shape when viewed from above. Each of the insulating films 140 is disposed such that respective sides are parallel to the end surfaces 52b or the end surface 52c. As shown in FIG. 5, when the dimension in the (10-10) direction of the gallium nitride substrate 52 is defined as L1, the dimension in the (0001) direction of the gallium nitride substrate 52 is defined as L2, the dimension in the (10-10) direction of each of the insulating films 140 is defined as I3, and the dimension in the (0001) direction of each of the insulating films 140 is defined as I4, the first ratio L1/L2=R1 and a third ratio I3/I4=R3 satisfy a relationship of 1.01R1≤R3≤1.25R1.

In the second embodiment, the gallium nitride substrate 52 is formed on the surface of the sapphire substrate 50 by epitaxial growth. Since the lattice constants of the sapphire and the gallium nitride are different from each other, the gallium nitride substrate 52 grows on the sapphire substrate 50 while generating strain. FIG. 6 shows literature values of the Young's moduli in respective plane direction of gallium nitride when gallium nitride is grown on a sapphire substrate disclosed in Roder et al., Journal of Applied Physics, 100 (103511), 2006, and the ratio of the Young's modulus in the (0001) direction to the Young's modulus in the (10-10) direction in the literature values. As shown in FIG. 6, in the gallium nitride substrate 52, the Young's modulus in the (0001) direction with respect to the Young's modulus in the (10-10) direction may be larger than that of a single crystal of gallium nitride. Therefore, the gallium nitride substrate 52 formed on the sapphire substrate 50 is more easily strained in the (10-10) direction than in the (0001) direction. However, in the present embodiment, the first ratio R1 and the third ratio R3 satisfy the relationship of 1.01R1≤R3≤1.25R1. Therefore, the stress applied from the insulating film 140 to the gallium nitride substrate 52 is larger in the (10-10) direction than in the (0001) direction. By setting the dimension of the insulating film 140 in this manner, the difference in the strain amount between the (10-10) direction and the (0001) direction of the gallium nitride substrate 52 is reduced. In particular, the third ratio R3 is set to be 1.01 to 1.25 times as large as the first R1, which is a value substantially equal to the ratio of the Young's modulus in the (0001) direction to the Young's modulus in the (10-10) direction of the gallium nitride substrate 52 shown in FIG. 6. Therefore, the strain amount of the gallium nitride substrate 52 is made uniform by the stress applied from the insulating film 140.

In the present embodiment, the insulating film 140 is an example of a "pattern film". The (10-10) direction and the (0001) direction are examples of the "first direction" and the "second direction", respectively.

Third Embodiment

Figure 7:
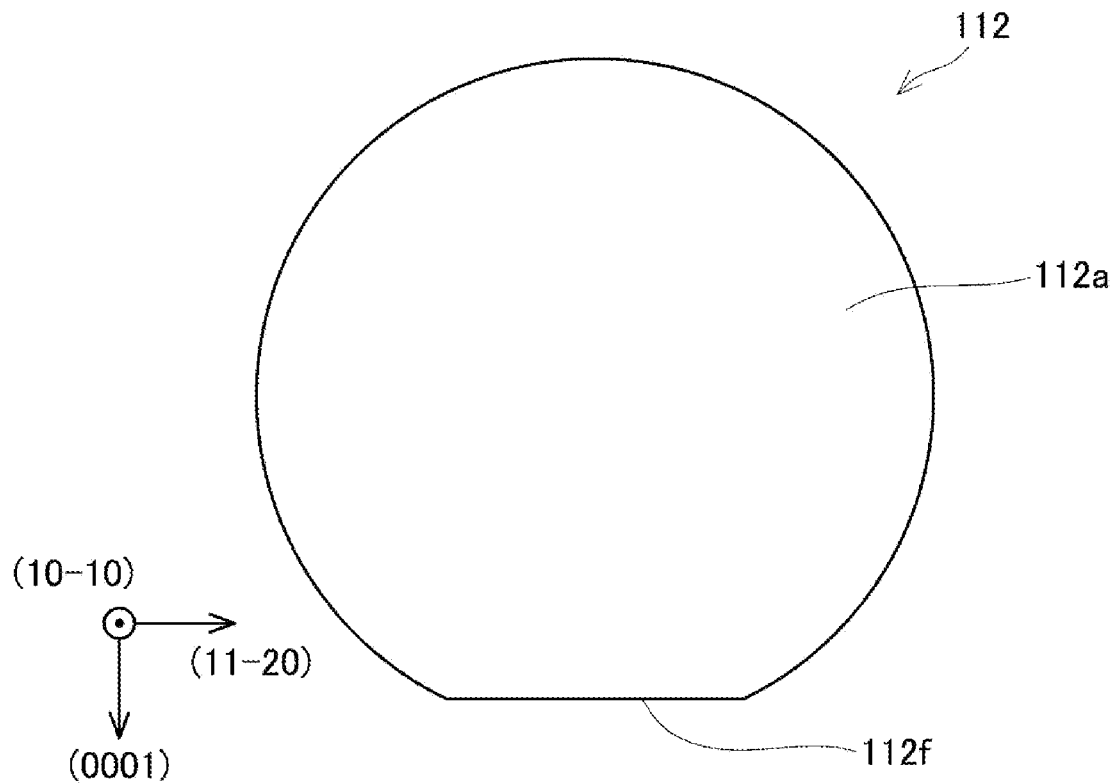
FIG. 7 is a plan view of a gallium nitride substrate in a manufacturing method according to a third embodiment.

Next, a manufacturing method of a semiconductor device according to a third embodiment will be described with reference to the drawings. In the manufacturing method of the third embodiment, the semiconductor device is manufactured from a gallium nitride substrate 112. FIG. 7 shows the gallium nitride substrate 112 to be processed. The gallium nitride substrate 112 is formed of a single crystal of gallium nitride. The gallium nitride substrate 112 has an orientation flat 112f in a part of an outer peripheral edge. A front surface 112a of the gallium nitride substrate 112 is an m-plane, a plane parallel to the orientation flat 112f of the gallium nitride substrate 112 is a c-plane, and a plane perpendicular to the m-plane and the c-plane is an a-plane. Hereinafter, a direction orthogonal to the m-plane is referred to as a (10-10) direction, a direction orthogonal to the c-plane is referred to as a (0001) direction, and a direction orthogonal to the a-plane is referred to as a (11-20) direction.

<Groove Portion Forming Process>

Figure 8:
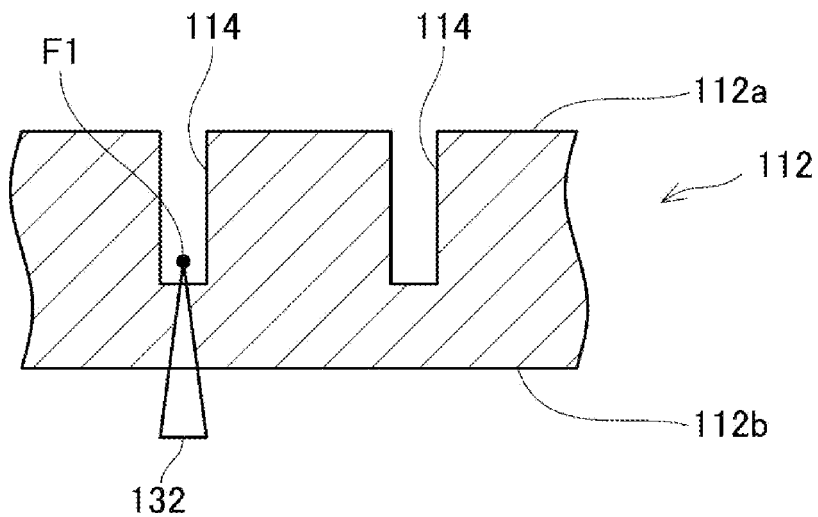
FIG. 8 is a diagram for explaining a groove portion forming process of the third embodiment.
Figure 9:
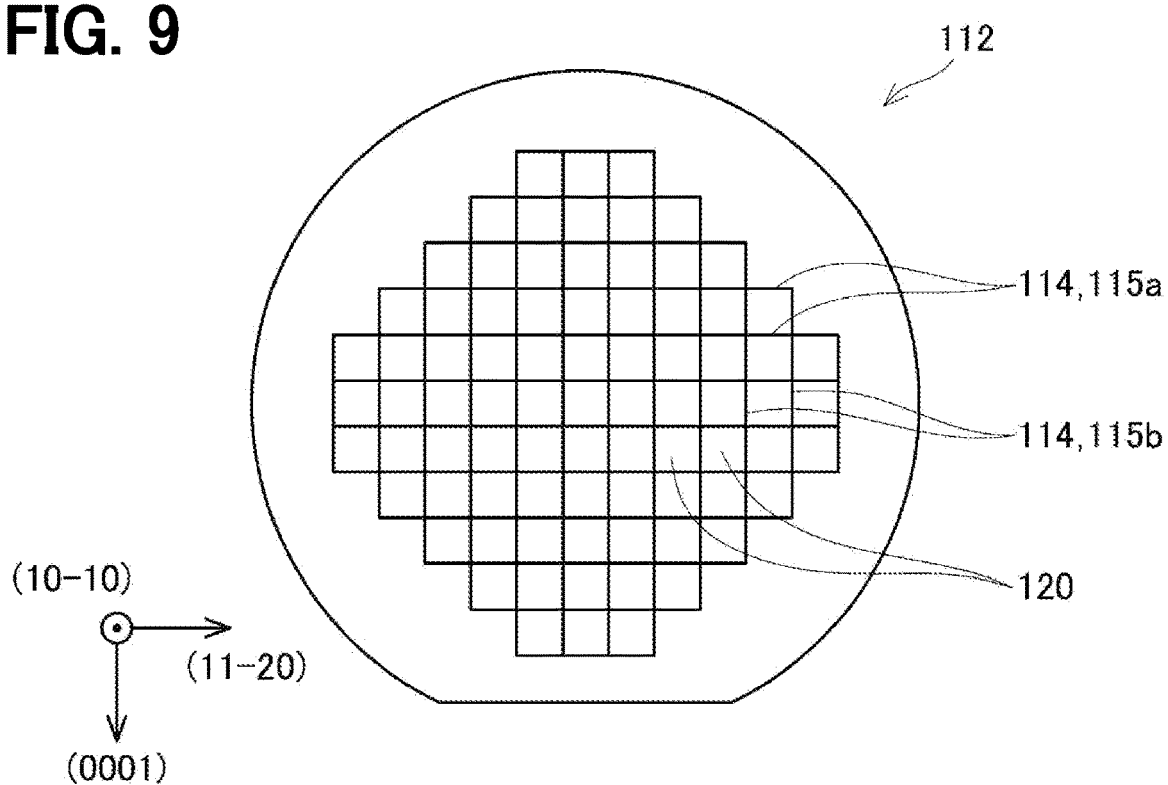
FIG. 9 is a diagram for explaining the groove portion forming process of the third embodiment.

When the semiconductor device is manufactured from the gallium nitride substrate 112, first, a groove portion forming process is performed. As shown in FIG. 8, in the groove portion forming process, a groove portion 114 is formed on the front surface 112a of the gallium nitride substrate 112. In the present embodiment, as shown in FIG. 8, the gallium nitride substrate 112 is irradiated with a laser 130 from a direction close to a rear surface 112b of the gallium nitride substrate 112. The laser 130 is emitted so as to form a focal point F1 in the gallium nitride substrate 112. The groove portion 114 is formed at a position irradiated with the laser 130. By moving the irradiation position of the laser 130, as shown in FIG. 9, the front surface 112a of the gallium nitride substrate 112 is partitioned into multiple regions 120. In the present embodiment, grooves 115a extending along the (11-20) direction and grooves 115b extending along the (0001) direction are formed. Thus, the front surface 112a of the gallium nitride substrate 112 is partitioned into the multiple regions 120 each having a rectangular shape defined by the grooves 115a and the grooves 115b.

Figure 10:
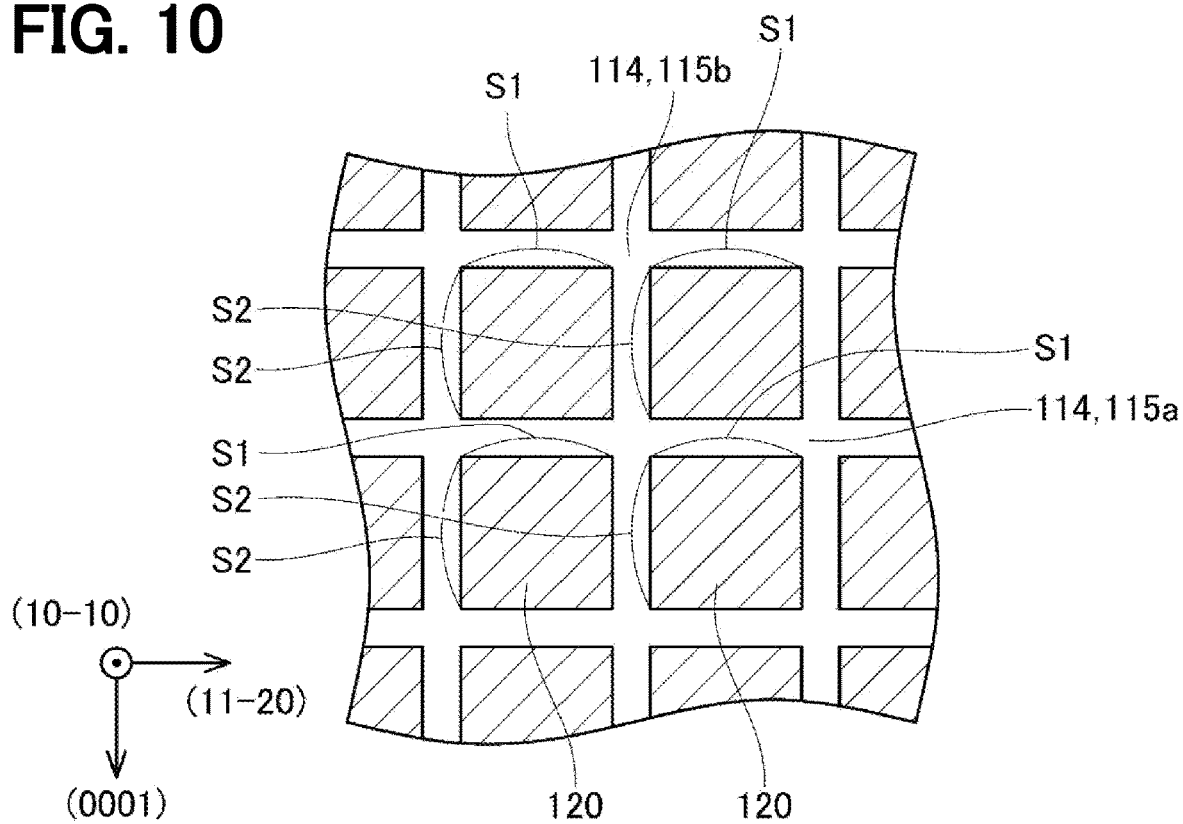
FIG. 10 is a diagram for explaining the groove portion forming process of the third embodiment.

In this process, as shown in FIG. 10, the groove portion 114 is formed so that a dimension S2 in the (0001) direction of each of the regions 120 is larger than a dimension S1 in the (11-20) direction of each of the regions 120. Specifically, in the present embodiment, the groove portion 114 is formed in the front surface 112a of the gallium nitride substrate 112 such that S1/S2 is 1.01 or more and 1.05 or less in each of the regions 120. In the groove portion forming process, the gallium nitride substrate 112 may be irradiated with the laser 130 from a direction close to the front surface 112a to form the groove portion 114 on the front surface 112a of the gallium nitride substrate 112. The grooves 115a and the grooves 115b may be formed to extend to the end surface (outer peripheral edge) of the gallium nitride substrate 112.

<Modified Layer Forming Process>

Figure 11:
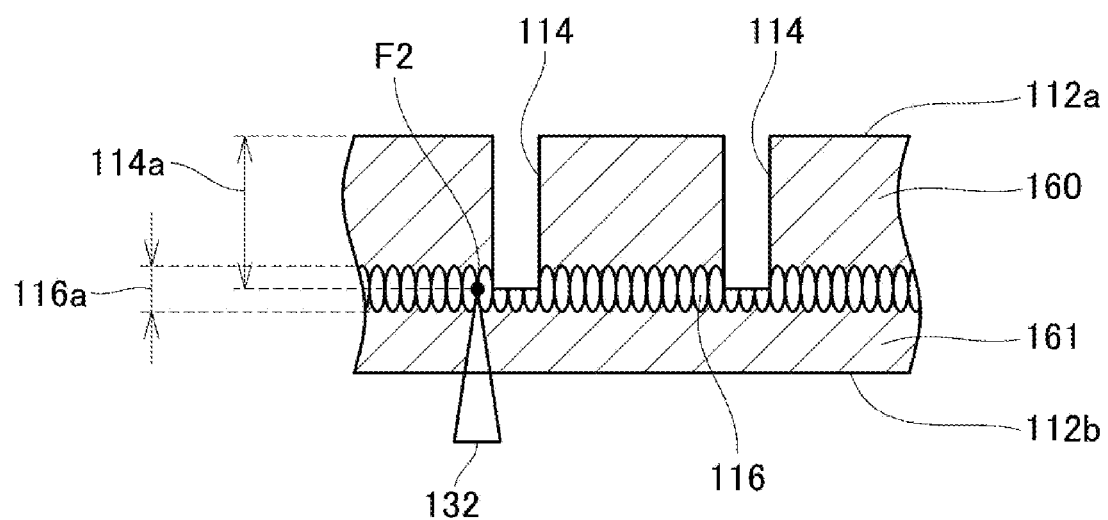
FIG. 11 is a diagram for explaining a modified layer forming process of the third embodiment.

Next, a modified layer forming process of forming a modified layer 116 inside the gallium nitride substrate 112 is performed. In the modified layer forming process, as shown in FIG. 11, the gallium nitride substrate 112 is irradiated with a laser 132 from the direction close to the rear surface 112b. The laser 132 is emitted so as to form a focal point F2 inside the gallium nitride substrate 112. At the position of the focal point F2, gallium nitride (GaN) is heated and decomposed. As a result, the modified layer 116 formed of a gallium precipitated layer or the like is formed at the position of the focal point F2. The strength of the modified layer 116 is lower than that of the original gallium nitride single crystal. In the present embodiment, the irradiation position of the laser 132 is moved in a direction parallel to the front surface 112a and the rear surface 112b of the gallium nitride substrate 112 so as to form the modified layer 116 extending along the front surface 112a and the rear surface 112b. In addition, the modified layer 116 is formed so that the modified layer 116 and the groove portion 114 overlap in a depth range. In other words, the modified layer 116 is formed so that a range 116a of the modified layer 116 in a thickness direction of the gallium nitride substrate 112 overlaps a range 114a of the groove portion 114 in the thickness direction of the gallium nitride substrate 112. The modified layer 116 is formed on the entire surface of the gallium nitride substrate 112 in the direction parallel to the front surface 112a and the rear surface 112b. Hereinafter, in the gallium nitride substrate 112, a portion between the front surface 112a and the modified layer 116 is referred to as a first portion 160, and a portion between the rear surface 112b and the modified layer 116 is referred to as a second portion 161.

<Substrate Dividing Process>

Figure 12:
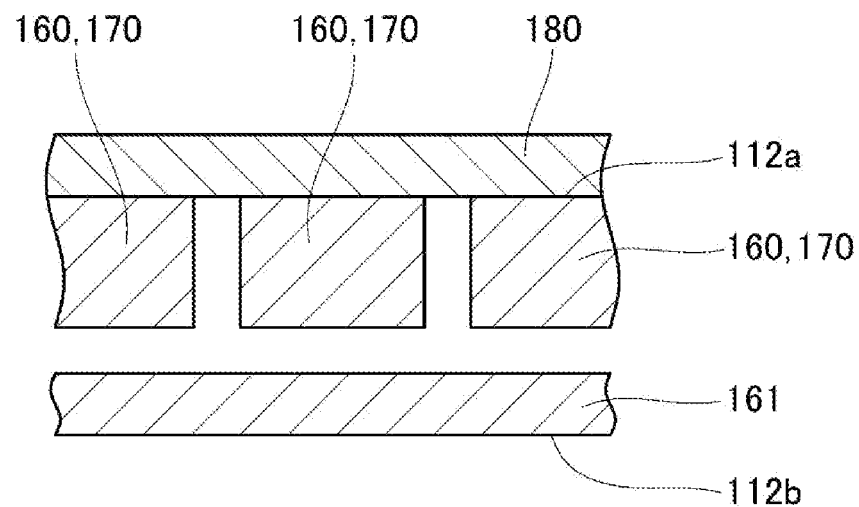
FIG. 12 is a diagram for explaining a substrate dividing process of the third embodiment.

Subsequently, a substrate dividing process is performed. In the substrate dividing process, as shown in FIG. 12, a support member 180 is attached to the front surface 112a of the gallium nitride substrate 112. The support member 180 may be a hard plate member or a sheet member having flexibility. Thereafter, by applying a force to the second portion 161 in a direction away from the first portion 160, the gallium nitride substrate 112 is divided along the modified layer 116. That is, the second portion 161 is separated from the first portion 160. As described above, since the strength of the modified layer 116 is lower than the strength of the gallium nitride single crystal, the gallium nitride substrate 112 can be divided along the modified layer 116. Since the first portion 160 has the groove portion 114 extending from the front surface 112a to the modified layer 116, the first portion 160 is divided into multiple chips 170. Thereafter, the semiconductor device is manufactured by a conventionally known method using the divided chips 170.

The strain amount of the gallium nitride substrate 112 in a specific direction is inversely proportional to the Young's modulus of the gallium nitride substrate 112 in the specific direction. Specifically, as shown in FIG. 3, since the Young's modulus in the (11-20) direction is smaller than the Young's modulus in the (0001) direction, strain is likely to occur in the (11-20) direction. The strain amount of the gallium nitride substrate 112 in the specific direction is proportional to the stress applied to the gallium nitride substrate 112 in the specific direction, that is, the dimension of the gallium nitride substrate 112 in the specific direction. In the manufacturing method of the present embodiment, when the groove portion 114 is formed on the front surface 112a of the gallium nitride substrate 112, the groove portion 114 is formed such that the dimension ratio S1/S2 between the (0001) direction and the (11-20) direction of each of the regions 120 defined by the groove portion 114 is 1.01 or more and 1.05 or less. Since the dimension 51 is larger than the dimension S2, the stress applied in the (0001) direction is larger than the stress applied in the (11-20) direction in each of the regions 120. Therefore, the difference in the strain amount between the (0001) direction and the (11-20) direction is reduced. In particular, S1/S2 is set to be 1.01 to 1.05, which is a value substantially equal to the ratio of the Young's modulus in the (0001) direction to the Young's modulus in the (11-20) direction of the single crystal gallium nitride shown in FIG. 3. Therefore, in the depth range in which the groove portion 114 is formed, the strain amount in the (0001) direction and the (11-20) direction is made uniform, and warpage is restricted in each of the regions 120. Since warpage is restricted in each of the regions 120, the gallium nitride substrate 112 can be irradiated with the laser 132 in parallel to the front surface 112a (that is, the m-plane). Therefore, the modified layer 116 can be formed along the m-plane. In addition, since the chip 170 divided along the modified layer 116 has a dimension ratio at which warpage is less likely to occur, the semiconductor device manufactured using the chip 170 has stable characteristics.

In the gallium nitride substrate 112, the second portion 161 between the rear surface 112b and the groove portion 114 is not partitioned. Therefore, warpage may occur in the second portion 161 of the gallium nitride substrate 112. However, the modified layer 116 is formed at a position overlapping the groove portion 114 in the depth range. Warping is restricted in the depth range in which the groove portion 114 is formed. Since the laser 132 is moved within the range in which the warpage is restricted, the laser 132 can be moved substantially parallel to the m-plane.

In the present embodiment, the modified layer 116 is formed along the m-plane. Since the m-plane is a plane that is more easily cleaved than other planes, the gallium nitride substrate 112 can be easily divided along the modified layer 116. In addition, the m-plane has better workability than other planes. Thus, when the divided plane is the m-plane, the semiconductor structure can be easily formed in a later process.

In the present embodiment, the (11-20) direction and the (0001) direction are examples of the "first direction" and the "second direction", respectively.

Fourth Embodiment

Figure 13:
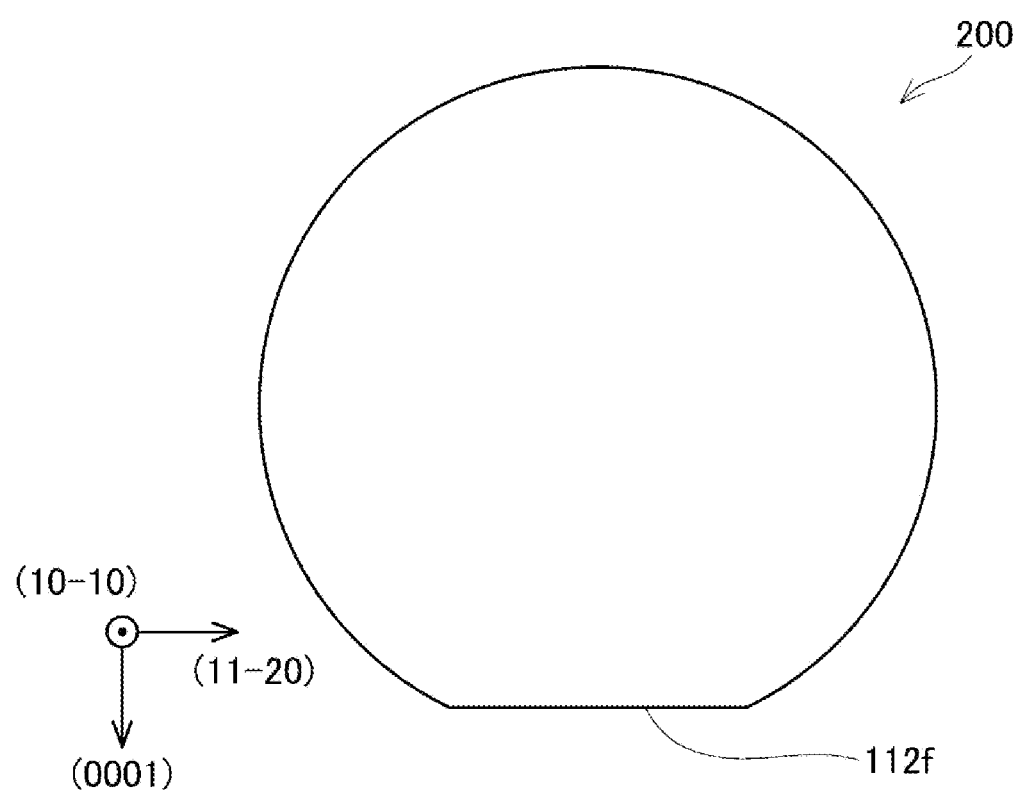
FIG. 13 is a plan view of a sapphire substrate in a manufacturing method according to a fourth embodiment.
Figure 14:
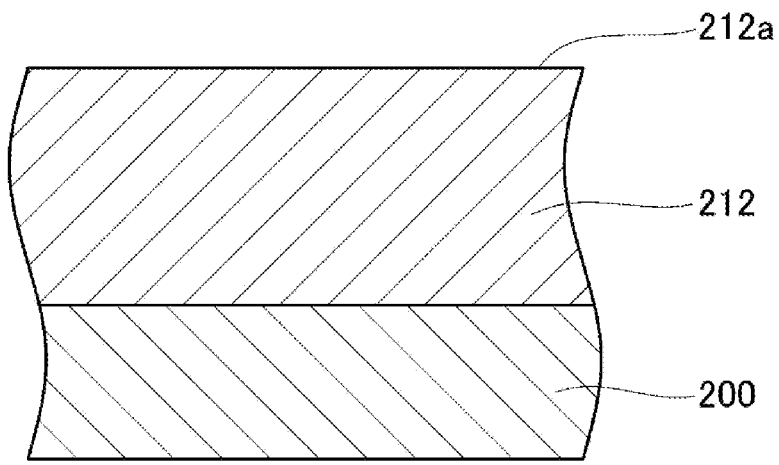
FIG. 14 is a diagram for explaining a gallium nitride growing process of the fourth embodiment.

In a fourth embodiment, a semiconductor device is manufactured using a sapphire substrate 200 shown in FIG. 13. First, as shown in FIG. 14, a gallium nitride layer 212 is formed on a surface of the sapphire substrate 200 by epitaxial growth. In the present embodiment, crystal growth of gallium nitride is performed on the surface of the sapphire substrate 200 so that a front surface 212a of the gallium nitride layer 212 becomes an a-plane.

Figure 15:
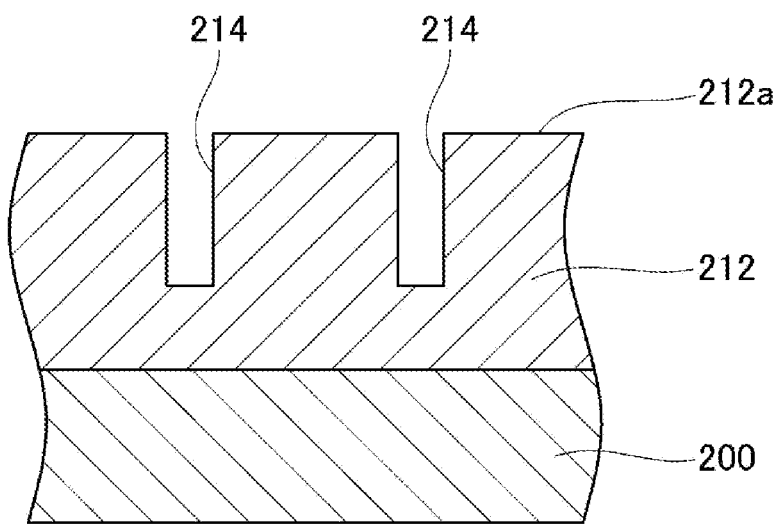
FIG. 15 is a diagram for explaining a groove portion forming process of the fourth embodiment.
Figure 16:
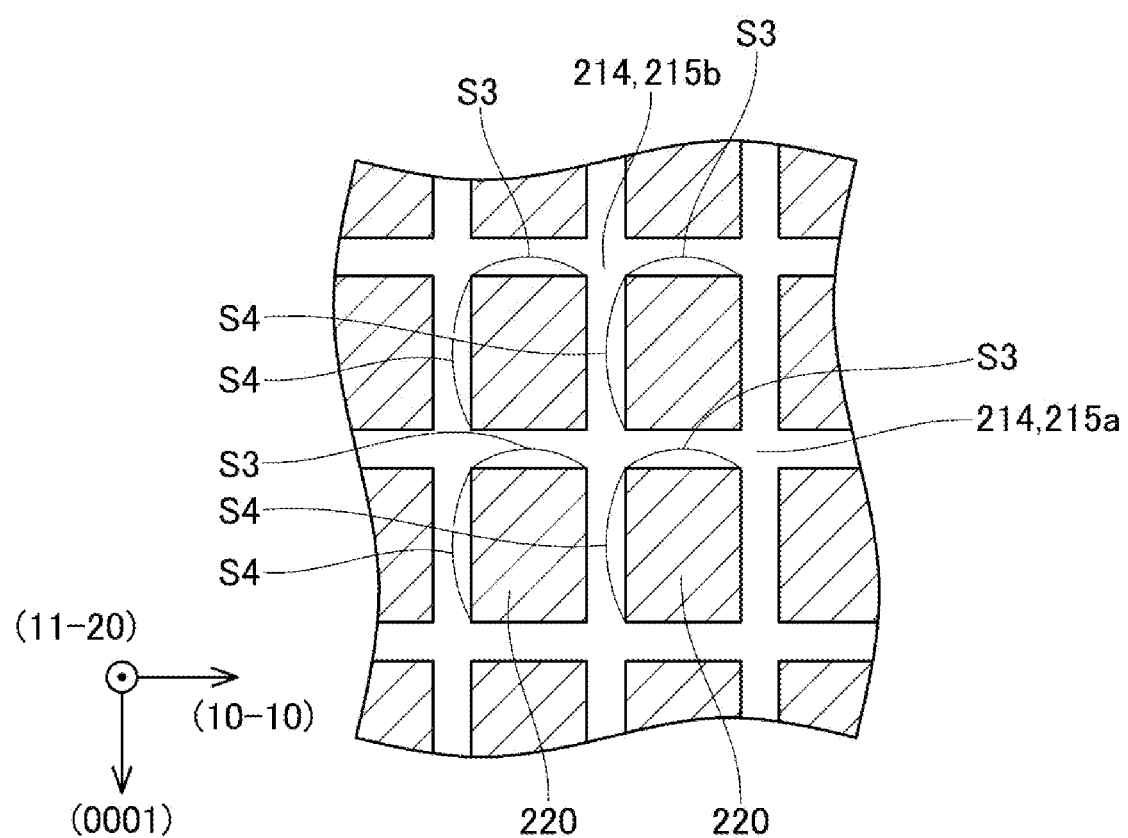
FIG. 16 is a diagram for explaining the groove portion forming process of the fourth embodiment.

Next, a groove portion forming process is performed. As shown in FIG. 15, a groove portion 214 is formed on the front surface 212*a* of the gallium nitride layer 212. In the present embodiment, similarly to FIG. 8 of the third embodiment, the groove portion 214 is formed by irradiating the gallium nitride layer 212 with a laser. By moving a laser irradiation position, as shown in FIG. 16, the front surface 212*a* of the gallium nitride layer 212 is partitioned into multiple regions 220. In the present embodiment, the groove portion 214 includes grooves 215*a* extending along the (10-10) direction orthogonal to the -m plane and grooves 215*b* extending along the (0001) direction orthogonal to the c-plane, so that the front surface 212*a* of the gallium nitride layer 212 is partitioned into multiple regions 220 each having a rectangular shape defined by the groove 215*a* and the groove 215*b*.

In the fourth embodiment, unlike the third embodiment, as shown in FIG. 16, the groove portion 214 is formed in the front surface 212*a* of the gallium nitride layer 212 such that the ratio S3/S4 of the dimension S4 in the (0001) direction and the dimension S3 in the (10-10) direction is 1.01 or more and 1.25 or less in each of the regions 220. Thereafter, as in the third embodiment, a modified layer is formed in a range overlapping with the groove portion 214 in the gallium nitride layer 212, and the gallium nitride layer 212 is divided along the formed modified layer.

In the present embodiment, the gallium nitride layer 212 is formed on the surface of the sapphire substrate 200 by epitaxial growth. Since the lattice constants of the sapphire and the gallium nitride are different from each other, the gallium nitride layer 212 grows on the sapphire substrate 200 while generating strain. Therefore, as described in the second embodiment, a ratio of the Young's modulus in the (0001) direction to the Young's modulus in the (10-10) direction of the gallium nitride layer 212 may be larger than that of the single crystal gallium nitride (see FIG. 6). In the present embodiment, S3/S4 is in the range of 1.01 or more and 1.25 or less. Therefore, in each of the regions 220, the stress applied in the (0001) direction is larger than the stress applied in the (10-10) direction. In particular, S3/S4 is set to be 1.01 to 1.25, which a value substantially equal to the ratio of the Young's modulus in the (0001) direction to the Young's modulus in the (10-10) direction of the gallium nitride shown in FIG. 6. Therefore, in the depth range in which the groove portion 214 is formed, the strain amount in the (0001) direction and the (10-10) direction is made uniform, and warpage is restricted in each of the regions 220.

In the present embodiment, the (10-10) direction and the (0001) direction are examples of the "first direction" and the "second direction", respectively.

OTHER EMBODIMENTS

In the first embodiment and the third embodiment described above, examples in which the (11-20) direction and the (0001) direction are the "first direction" and the "second direction", respectively, have been described. In the second embodiment and the fourth embodiment, examples in which the (10-10) direction and the (0001) direction are the "first direction" and the "second direction", respectively, have been described. However, the first direction and the second direction are not limited to the above, and the dimensions of the gallium nitride substrate and the pattern film and the dimensions of the groove portion formed in the gallium nitride substrate may be adjusted according to the difference in Young's modulus in each direction. Therefore, for example, the first direction may be the (0001) direction and the second direction may be the (11-20) direction, or the first direction may be the (0001) direction and the second direction may be the (10-10) direction. Furthermore, for example, the first direction may be the (10-10) direction and the second direction may be the (11-20) direction, or the first direction may be the (11-20) direction and the second direction may be the (10-10) direction. In other words, the front surface of the gallium nitride substrate may be the c-plane, the a-plane, or the m-plane.

In the first embodiment and the second embodiment described above, each of the insulating films 40 and 140 has the rectangular shape when viewed from above, but the shape of each of the insulating films 40 and 140 is not limited to the rectangular shape. For example, the shape of each of the insulating films 40 and 140 may be a hexagonal shape, another polygonal shape, or a circular shape. For example, in the first embodiment, a ratio obtained by dividing the maximum dimension of the insulating film 40 in the (11-20) direction by the maximum dimension in the (0001) direction may be represented by R2, and in the second embodiment, a ratio obtained by dividing the maximum dimension of the insulating film 140 in the (10-10) direction by the maximum dimension in the (0001) direction may be represented by R2.

In the first embodiment and the second embodiment described above, examples in which each of the gallium nitride substrates 12 and 52 has a substantially square shape when viewed from above have been described, but the ratio between L1 and L2 is not particularly limited.

In the first embodiment and the second embodiment described above, the insulating film is described as an example of the pattern film disposed on the front surfaces 12*a* and 52*a* of the gallium nitride substrates 12 and 52. However, the type of the pattern film disposed on the front surfaces 12*a* and 52*a* is not particularly limited, and may be, for example, a metal film or the like.

In addition, in the first embodiment and the second embodiment, the lateral MOSFET is described as an example of the semiconductor devices 10 and 100, but the present disclosure may be applied to a vertical semiconductor device.

Note that it is reported in Bahat Treidel et al., Journal of the Electron Devices Society, 9, 215-228, 2021 that an a-plane has higher channel mobility than an m-plane in the a-plane and the m-plane when an inner surface of a trench formed on a surface of a gallium nitride substrate is treated with tetramethylammonium hydroxide (TMAH). Therefore, in the case of performing the treatment by TMAH in the manufacturing process of the semiconductor device, for example, by performing the treatment so that a channel is formed along the a-plane direction, a semiconductor device having high channel mobility (that is, low on-resistance) can be obtained.

Although the embodiments have been described in detail above, these are merely examples and do not limit the scope of claims. The techniques described in the claims include various modifications and modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:

1. A semiconductor device comprising:
   a gallium nitride substrate; and
   a pattern film disposed on a front surface of the gallium nitride substrate, wherein
   in the gallium nitride substrate, a Young's modulus in a first direction along the front surface is larger than a Young's modulus in a second direction along the front surface and orthogonal to the first direction, and
   a first ratio R1 obtained by dividing a dimension of the gallium nitride substrate by a dimension of the gallium nitride substrate in the second direction and a second ratio R2 obtained by dividing a dimension of the pattern film in the first direction by a dimension of the pattern film in the second direction satisfy a relationship of R1<R2.

2. The semiconductor device according to claim 1, wherein
   the first ratio R1 is greater than 1, and
   the second ratio R2 is greater than 1.

3. The semiconductor device according to claim 1, wherein
   the front surface is an m-plane, the first direction is a (0001) direction, and the second direction is a (11-20) direction.

4. The semiconductor device according to claim 3, wherein
   the first ratio R1 and the second ratio R2 satisfy a relationship of $1.01R1 \leq R2 \leq 1.25R1$.

5. The semiconductor device according to claim 3, wherein
   the first ratio R1 and the second ratio R2 satisfy a relationship of $1.01R1 \leq R2 \leq 1.05R1$.

6. A manufacturing method of a semiconductor device, comprising:
   forming a groove portion on a front surface of a gallium nitride substrate to divide the front surface of the gallium nitride substrate into a plurality of regions;
   irradiating the gallium nitride substrate with a laser to form a modified layer that extends along the front surface and is located inside the gallium nitride substrate in a depth range of the groove portion; and
   dividing the gallium nitride substrate along the modified layer, wherein
   in the gallium nitride substrate, a Young's modulus in a first direction along the front surface is larger than a Young's modulus in a second direction along the front surface and orthogonal to the first direction, and
   the forming of the groove portion includes forming the groove portion along the first direction and the second direction to partition the front surface into the plurality of regions such that a dimension of each of the plurality of regions in the first direction is larger than a dimension of each of the plurality of regions in the second direction.

7. The manufacturing method according to claim 6, wherein
   the front surface is an m-plane, the first direction is a (0001) direction, and the second direction is a (11-20) direction.

8. The manufacturing method according to claim 7, wherein
   a ratio S obtained by dividing the dimension of each of the plurality of regions in the first direction by the dimension of each of the plurality of regions in the second direction satisfies a relationship of $1.01 \leq S \leq 1.25$.

9. The manufacturing method according to claim 7, wherein
   a ratio S obtained by dividing the dimension of each of the plurality of regions in the first direction by the dimension of each of the plurality of regions in the second direction satisfies a relationship of $1.01 \leq S \leq 1.05$.

* * * * *